United States Patent
Hashimoto

(10) Patent No.: US 6,849,497 B2
(45) Date of Patent: Feb. 1, 2005

(54) METHOD OF FABRICATING A SEMICONDUCTOR INTEGRATED CIRCUIT INCLUDING A CAPACITOR FORMED ON A SINGLE INSULATING SUBSTRATE LAYER HAVING LOWER BORON DOSE IN THE VICINITY OF THE SURFACE THEREOF

(75) Inventor: Keiichi Hashimoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/425,593

(22) Filed: Apr. 30, 2003

(65) Prior Publication Data

US 2004/0102011 A1 May 27, 2004

(30) Foreign Application Priority Data

Nov. 26, 2002 (JP) .................................... 2002-341889

(51) Int. Cl.⁷ .......................................... H01L 21/8238
(52) U.S. Cl. ...................... 438/244; 428/233; 428/680; 257/288; 257/E21.275
(58) Field of Search ........................ 438/233, FOR 163, 438/FOR 426, 244–246, 255–256, 680; 257/E21.275

(56) References Cited

U.S. PATENT DOCUMENTS

| 6,127,287 A | 10/2000 | Hurley et al. | |
| 6,159,849 A | 12/2000 | Kang et al. | |
| 6,303,496 B1 * | 10/2001 | Yu | 438/668 |
| 6,407,002 B1 * | 6/2002 | Lin et al. | 438/713 |
| 6,528,368 B1 * | 3/2003 | Park | 438/253 |
| 6,548,853 B1 * | 4/2003 | Hwang et al. | 257/306 |
| 6,734,108 B1 * | 5/2004 | Jin et al. | 438/700 |
| 2002/0081864 A1 * | 6/2002 | Zheng et al. | 438/791 |

FOREIGN PATENT DOCUMENTS

| JP | 02-016763 | 1/1990 | |
| JP | 07-283213 | 10/1995 | |
| JP | 07-297182 | 11/1995 | |
| JP | 09064171 A * | 3/1997 | H01L/21/768 |
| JP | 10-284693 | 10/1998 | |

\* cited by examiner

Primary Examiner—George Fourson
Assistant Examiner—Thanh V Pham
(74) Attorney, Agent, or Firm—Rabin & Berdo, P.C.

(57) ABSTRACT

In the case where holes are defined in BPSG films, respectively, lower electrodes are formed of polysilicon inside the holes, respectively, a nitride film is formed on top of the respective lower electrodes and one of the BPSG films, and the nitride film is subjected to healing oxidation in a wet atmosphere later in order to prevent oxidation of contact plugs and the lower electrodes, nitrogen is diffused into the upper surface of the BPSG film by ion implantation or boron dose in a layer in the vicinity of the surface of the BPSG film is lowered.

22 Claims, 5 Drawing Sheets

METHOD OF FABRICATING A SEMICONDUCTOR INTEGRATED CIRCUIT INCLUDING A CAPACITOR FORMED ON A SINGLE INSULATING SUBSTRATE LAYER HAVING LOWER BORON DOSE IN THE VICINITY OF THE SURFACE THEREOF

FIELD OF THE INVENTION

The present invention relates to a method of fabricating a semiconductor integrated circuit for an improvement of the film quality of a silicon nitride film, and in particular, for the control of initial growth of the silicon nitride film.

BACKGROUND OF THE INVENTION

With a conventional method of fabricating a semiconductor integrated circuit, respective MOSFETs are fabricated by forming isolation regions in a silicon substrate at the start, and subsequently, by forming diffusion regions to serve as a source and a drain, respectively, and a gate electrode covered with a silicon nitride film. Thereafter, a first BPSG film is formed so as to cover those elements, contact holes are defined at predetermined positions in the first BPSG film, respectively, contact plugs are formed by filling up the contact holes with P (phosphorus)-doped polysilicon, respectively, and subsequently, a second BPSG film is deposited on top of the contact plugs, thereby defining holes at predetermined positions where respective capacitors are to be formed. Thereafter, a P-doped polysilicon film to serve as respective lower electrodes is deposited, the P-doped polysilicon film is covered with a protection film such as a resist, and so forth, portions of the P-doped polysilicon film on top of the second BPSG film are removed along with the protection film by etching back, and so forth, and the P-doped polysilicon film is left out only on the inner wall and bottom of the respective holes by removing the protection film inside the respective holes by use of an asher. Portions of the P-doped polysilicon film as left out become the respective lower electrodes.

Next, after cleaning, a thermal nitriding film with an extremely small thickness (on the order of 15 to 20 Å) is formed on the surface of the respective lower electrodes of polysilicon by use of a low pressure CVD (LP-CVD) furnace, and a silicon nitride film is deposited on top of the respective lower electrodes of polysilicon by a CVD method so as to enable a capacitor insulating film to obtain a predetermined thickness. Thereafter, healing oxidation is applied thereto in a wet atmosphere in order to improve the film quality of the capacitor insulating film. Finally, a P-doped polysilicon film to serve as respective upper electrodes is deposited, and predetermined patterning is applied thereto, thereby forming the respective capacitors.

With the conventional method described above, however, at the time of forming the thermal nitriding film on top of the second BPSG film, there occurs incubation on BPSG, and the start of deposition of the silicon nitride film thereon lags behind that on the polysilicon film of the respective lower electrodes, so that the final thickness of the silicon nitride film on top of the second BPSG film becomes smaller than that on the polysilicon film. Consequently, there has arisen a problem in that the lower electrodes and contact plugs have undergone oxidation during healing oxidation in a wet atmosphere, applied later, resulting in failure to form capacitors having desired characteristics.

SUMMARY OF THE INVENTION

The invention has been developed to resolve the problem described, and it is an object of the invention to provide a method of fabricating a semiconductor integrated circuit whereby oxidation of lower electrodes and contact plugs, formed of polysilicon, can be prevented.

To that end, a method of fabricating a semiconductor integrated circuit, according to the invention, comprises a step of fabricating respective MOSFETs by forming diffused regions in a silicon substrate and a gate electrode, a step of forming a first BPSG film so as to cover the silicon substrate and the gate electrodes, a step of defining first holes in the first BPSG film and forming a contact plug, made of polysilicon and connected with the respective diffused regions, in the respective first holes, a step of forming a second BPSG film on top of the first BPSG film 18 and the respective contact plugs, a step of defining second holes in the second BPSG film in such a way as to expose the respective upper surfaces of the contact plugs, a step of forming a first polysilicon film on the respective interiors of the second holes, and on top of the upper surface of the second BPSG film, a step of covering the first polysilicon film with a protection film, a step of exposing the upper surface of the second BPSG film by removing portions of the first polysilicon film, on top of the second BPSG film, and the protection film on top of the portions of the first polysilicon film, and further by removing the protection film inside the respective second holes while leaving out the first polysilicon film inside the respective the second holes, a step of forming a nitride film on top of the first polysilicon film and the second BPSG film, a step of applying healing oxidation a wet atmosphere, and a step of forming a second polysilicon film on top of the nitride film.

In accordance with a first aspect of the invention, a nitride layer is formed in the vicinity of the surface of the second BPSG film by diffusing nitrogen from the upper surface of the second BPSG film, as exposed, by ion implantation after removing portions of the first polysilicon film, on top of the second BPSG film, and the protection film on top of the portions of the first polysilicon film, and before removing the protection film inside the respective second holes.

In accordance with a second aspect of the invention, the second BPSG film 122 is formed in such a way as to lower boron dose in a layer in the vicinity of the surface of the second BPSG film 122.

DETAILED DESCRIPTION OF PREFERRED EMBODIMENTS OF THE INVENTION

A first embodiment of a method of fabricating a semiconductor integrated circuit according to the invention is described hereinafter with reference to FIGS. 1(A) to 3(C). These figures are sectional views of a memory cell array of a DRAM as an example of a semiconductor integrated circuit in respective steps of the method of fabricating the semiconductor integrated circuit according to the first embodiment.

Figure 1A:
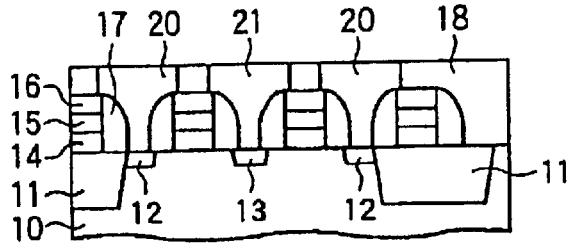
FIGS. 1(A) to 1(D) are sectional views showing respective steps of a method of fabricating a semiconductor integrated circuit according to a first embodiment of the invention.

As shown in FIG. 1(A), isolation regions 11 are first formed in a silicon (Si) substrate 10 by the STI (Shallow Trench Isolation) method, a diffused region 12 serving as a drain, and a diffused region 13 serving as a source are further formed so as to adjoin the respective isolation regions 11, a gate insulating film 14 and a gate electrode 15 are further formed, and additionally, a protection cap 16 and a sidewall spacer 17 are formed of a nitride film, respectively, thereby forming respective MOSFETs. The gate electrode 15 doubles as a word line.

Next, BPSG (borophosphosilicate glass) is deposited so as to cover the silicon (Si) substrate 10 and the gate electrodes 15 (and the respective sidewall spacers 17 and protection caps 16 of the gate electrodes 15), thereby forming a first BPSG film 18. The first BPSG film 18 is densified by BPSG flow, and is planarized by CMP (chemical mechanical polishing). Thereafter, contact holes for making contact with the diffused regions, respectively, are defined, and P (phosphorus)-doped polysilicon is deposited to fill up the respective contact holes, thereby forming contact plugs 20, 21. Among those contact plugs, the contact plug 20 connected with the diffused region 12 serving as the drain will be connected with a lower electrode of a capacitor later while the contact plug 21 connected with the diffused region 13 serving as the source will be connected with a bit line later. The respective surfaces of the contact plugs 20, 21 are planarized by etching back or CMP.

Figure 1B:
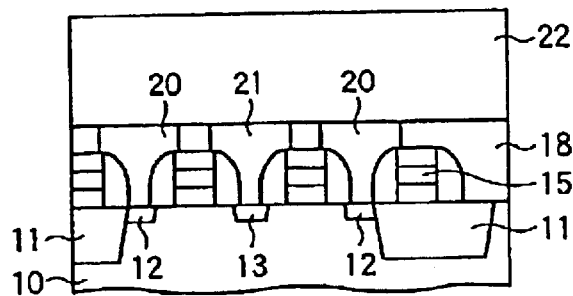

Next, as shown in FIG. 1(B), BPSG is deposited on top of the first BPSG film 18 and the contact plugs 20, 21 to thereby form a second BPSG film 22, serving as a foundation for the respective lower electrodes of the capacitors.

Such deposition is carried out by an atmospheric pressure CVD method on conditions of, for example, heating temperature at about 400° C., and a source gas flow rate at $N_2/O_3$/TEOS/TMP/TEB=18/7.5/3.0/1.80/1.70 (SLM). Herein, TEOS denotes tetraethylorthosilic trimethylphosphate, and TEB triethyl boron, respectively. Subsequently, densification of the film is carried out by BPSG flow.

Figure 1C:
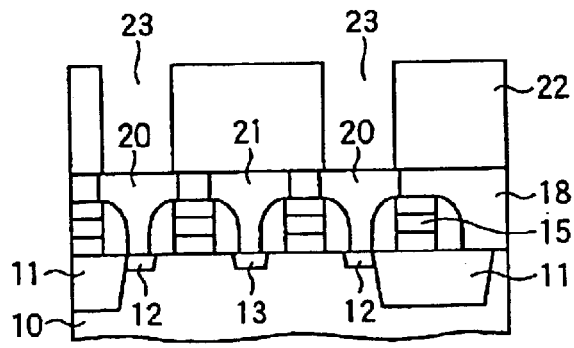

Then, as shown in FIG. 1(C), a hole 23 is formed at predetermined positions of the second BPSG film 22 where the respective capacitors are to be formed. As a result of the formation of the holes 23, the respective upper surfaces of the contact plugs 20 are exposed.

Figure 1D:
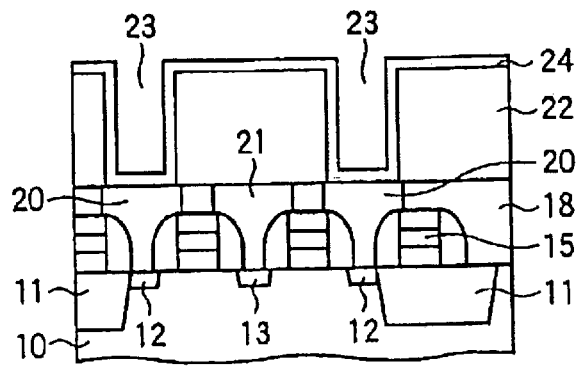

Subsequently, as shown in FIG. 1(D), P (phosphorus)-doped polysilicon is deposited on the respective interiors (sides and the bottom) of the holes 23, and on the upper surface of the second BPSG film 22 by a CVD method, thereby forming a polysilicon film 24. Portions of the polysilicon film 24 are used as the respective lower electrodes later, and are in contact with the respective contact plugs 20 inside (at the bottom of) the holes 23, to be electrically connected therewith.

Figure 2A:
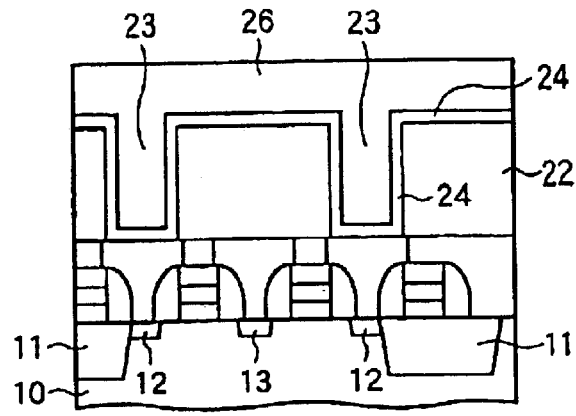
FIGS. 2(A) to 2(C) are sectional views showing respective steps of the method of fabricating the semiconductor integrated circuit according to the first embodiment.

Next, as shown in FIG. 2(A), an organic protection film 26, made of a resist or BARC (bottom anti-reflective coating), is formed on top of the polysilicon film 24 on the inner face of the respective holes 23, and on top of portions of the polysilicon film 24, outside of the respective holes 23, to thereby protect the polysilicon film 24.

Figure 2B:
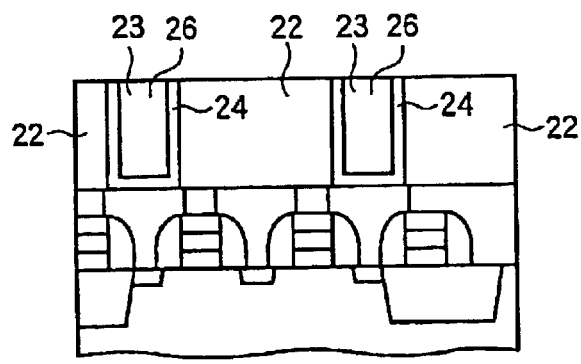

Subsequently, as shown in FIG. 2(B), the protection film 26 along with the portions of the polysilicon film 24, on top of the second BPSG film 22, are removed by etching back or CMP.

As a result of such etching back or CMP, the polysilicon film 24 and the protection film 26 are left out only inside the respective holes 23 defined in the second BPSG film 22, exposing the upper surface of the second BPSG film 22.

Figure 2C:
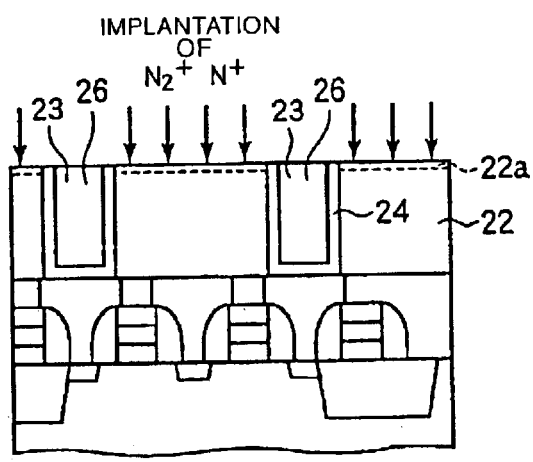

Next, as shown in FIG. 2(C), nitrogen is diffused into the second BPSG film 22 by implantation of $N_2+$ ions or $N+$ ions from the upper surface of the second BPSG film 22 exposed as described above, thereby forming a nitride layer 22a in the vicinity of the surface of the second BPSG film 22.

Ion implantation is carried out under conditions of, for example, acceleration energy at not more than about 10 KeV and a dose in a range of about 1E15 to $1E17/cm^3$.

Figure 3A:
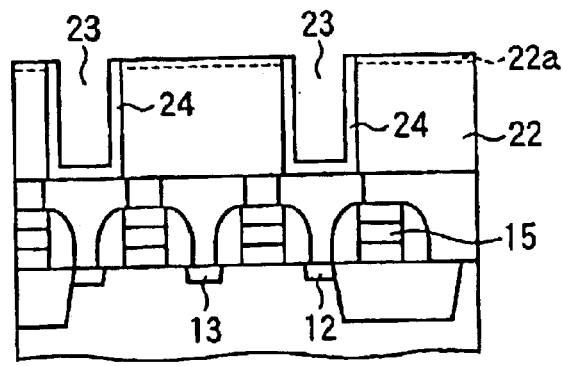
FIGS. 3(A) to 3(C) are sectional views showing respective steps of the method of fabricating the semiconductor integrated circuit according to the first embodiment.

Subsequently, as shown in FIG. 3(A), the respective protection films 26 inside the holes 23 are removed by use of an asher. The respective polysilicon films 24 remaining inside the holes 23 after such processing will become the respective lower electrodes of the capacitors later.

In this connection, the respective polysilicon films 24 inside the holes 23 each may have HSG (Hemispherical Grain) or a rougher surface (by deposition of rough-surface polysilicon) in order to increase a surface area of each of the lower electrodes 24 with the aim of increasing the capacitance of the respective capacitors.

Figure 3B:
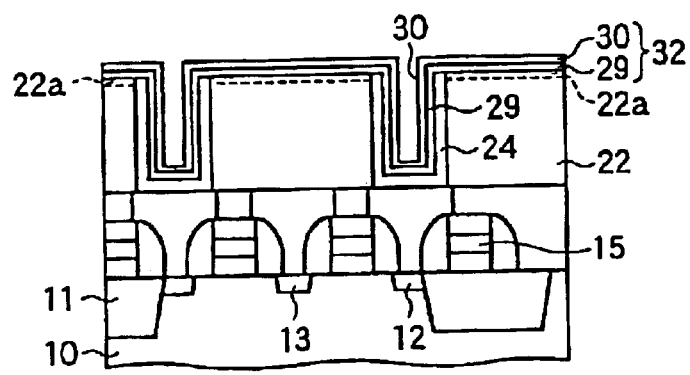

Then, as shown in FIG. 3(B), after cleaning, nitriding by heating is executed in $NH_3$ atmosphere by use of a low pressure CVD (LP-CVD) furnace under conditions of, for example, process temperature at about 800 to 850° C., $NH_3$ as a source gas, a flow rate thereof at 2000 sccm, pressure at about 533 Pa (4 Torr), and process time of about 20 to 30 minutes. As a result of such nitriding, a thermal nitriding film 29 with an extremely small thickness is formed on the respective upper surfaces of the lower electrodes 24 of polysilicon. The thermal nitriding film 29 is formed to a thickness of, for example, on the order of 15 to 20 Å.

Next, following the formation of the thermal nitriding film 29, a silicon nitride film 30 is formed on top of the thermal nitriding film 29 in the same furnace by a CVD method.

CVD is executed under conditions of, for example, a substrate temperature at about 690° C., a flow rate of a source gas at $SiH_2Cl_2/NH_3$=30/150 (sccm), and pressure at about 20 Pa (0.15 Torr). A nitride film 32 made up of the silicon nitride film 30 formed by the CVD described, and the thermal nitriding film 29 previously formed, in combination with the former, serves as a capacitor insulating film 32, and the CVD is executed such that the capacitor insulating film 32 is formed to a thickness of a predetermined value, for example, 40 Å.

Subsequently, healing oxidation at about 850° C. is applied to the capacitor insulating film 32 in a wet atmosphere in order to improve the film quality thereof.

Figure 3C:
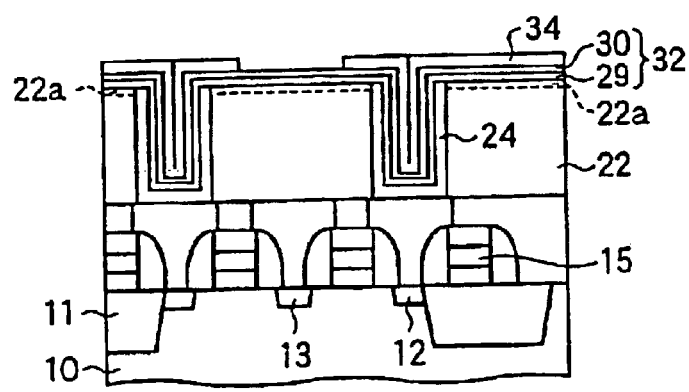

Next, as shown in FIG. 3(C), a polysilicon film 34 doped with phosphorus at $5E20/cm^3$, serving as upper electrodes, is deposited on the capacitor insulating film 32, and a predetermined patterning is applied to the polysilicon film 34. The respective capacitors are thereby formed.

In addition, there are applied other steps such as the step of connecting the contact plug 21 connected with the respective diffused regions 13, serving as the source, to the bit line (not shown), however, description thereof is omitted herein.

As described in the foregoing, with the first embodiment of the invention, since nitrogen is diffused in the vicinity of the surface of the second BPSG film 22 by ion implantation, the nitride layer 22a is formed in the vicinity of the surface thereof. Consequently, because the occurrence of incubation is curbed at the time of forming the silicon nitride film by the low pressure CVD method in a later stage, a silicon nitride film with a thickness equivalent to that of the silicon nitride film on top of the lower electrodes 24 can be formed over the second BPSG film 22 as well (FIG. 3(B)). Accordingly, sufficient oxidation resistance can be obtained even during the healing oxidation applied thereafter, so that it is possible to prevent intrusion of oxide species into the interior, and to prevent oxidation of the lower electrodes 24 and contact plugs 20. Hence, the capacitors having the desired characteristics can be obtained.

Second Embodiment

Next, a second embodiment of a method of fabricating a semiconductor integrated circuit according to the invention is described hereinafter with reference to FIGS. 4(A) to 5(D). These figures are sectional views of a memory array of a DRAM as an example of a semiconductor integrated circuit in respective steps of the method of fabricating the semiconductor integrated circuit according to the second embodiment.

Figure 4A:
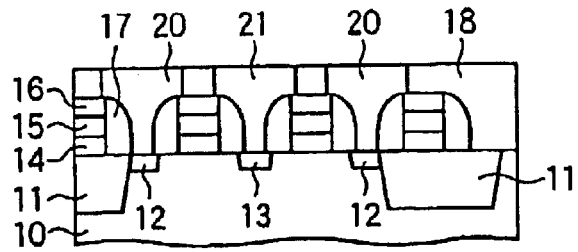
FIGS. 4(A) to 4(D) are sectional views showing respective steps of a method of fabricating a semiconductor integrated circuit according to a second embodiment of the invention.

A first step shown in FIG. 4(A) is the same as the step of the first embodiment as described with reference to FIG. 1(A).

That is, as shown in FIG. 4(A), isolation regions 11 are first formed in a silicon (Si) substrate 10 by the STI (Shallow Trench Isolation) method, a diffused region 12 serving as a drain, and a diffused region 13 serving as a source are further formed so as to adjoin the respective isolation regions 11, a gate insulating film 14 and a gate electrode 15 are further formed, and additionally, a protection cap 16 and a sidewall spacer 17 are formed of a nitride film, respectively, thereby forming respective MOSFETs. The gate electrode 15 doubles as a word line.

Next, BPSG (borophosphosilicate glass) is deposited so as to cover the silicon (Si) substrate 10 and the gate electrodes 15 (and the respective sidewall spacers 17 and protection caps 16 of the gate electrodes 15), thereby forming a first BPSG film 18. The first BPSG film 18 is densified by BPSG flow, and is planarized by CMP (chemical mechanical polishing).

Thereafter, contact holes for making contact with the diffused regions 13, respectively, are defined, and P (phosphorus)-doped polysilicon is deposited to fill up the respective contact holes, thereby forming contact plugs 20, 21. Among those contact plugs, the contact plug 20 connected with the diffused region 12 serving as the drain will be connected with a lower electrode of a capacitor later while the contact plug 21 connected with the diffused region 13 serving as the source will be connected with a bit line later. The respective surfaces of the contact plugs 20, 21 are planarized by etching back or CMP.

Figure 4B:
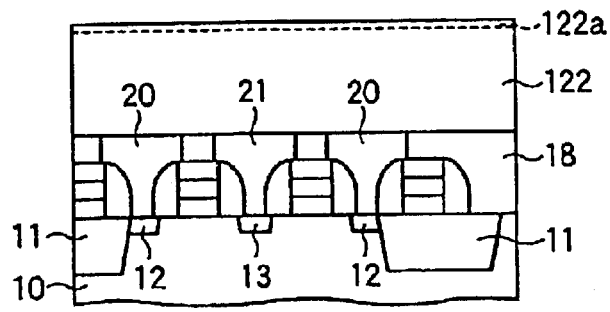

Following the step shown in FIG. 4(A), BPSG is deposited on top of the first BPSG film 18 and the contact plugs 20, 21, as shown in FIG. 4(B), to thereby form a second BPSG film 122 serving as a foundation for the respective lower electrodes of the capacitors.

Such deposition is carried out by an atmospheric pressure CVD method on conditions of, for example, heating temperature at about 400° C., and a source gas flow rate at $N_2/O_3/TEOS/TMP/TEB=18/7.5/3.0/1.80/1.70$ (SLM).

In this case, however, supply of TEB, that is, a supply source of boron, is stopped for a period corresponding to about 10% of film-forming time from the end thereof. The second BPSG film 122 having a layer (122a) lightly doped with boron, in the vicinity of the surface thereof, is thereby formed.

Subsequently, densification of the film is carried out by BPSG flow.

Subsequent steps are broadly the same as those of the first embodiment except that a processing step of the first embodiment, as shown in FIG. 2(C), that is, the formation of the nitride layer 22a by ion implantation is not carried out.

Figure 4C:
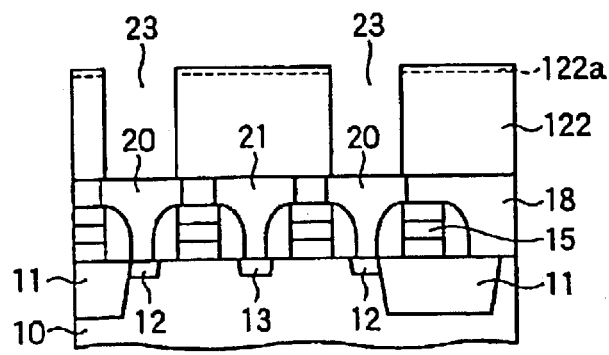

More specifically, as shown in FIG. 4(C), a hole 23 is first formed at predetermined positions of the second BPSG film 122 where the respective capacitors are to be formed. As a result of the formation of the holes 23, the respective upper surfaces of the contact plugs 20 are exposed.

Figure 4D:
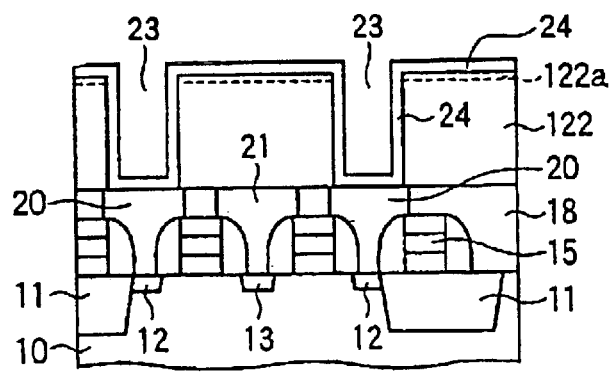

Subsequently, as shown in FIG. 4(D), P (phosphorus)-doped polysilicon is deposited on the respective interiors (sides and the bottom) of the holes 23, and on the upper surface of the second BPSG film 122 by a CVD method, thereby forming a polysilicon film 24. Portions of the polysilicon film 24 are used as the respective lower electrodes later, and are in contact with the respective contact plugs 20 inside (at the bottom of) the holes 23, to be electrically connected therewith.

Figure 5A:
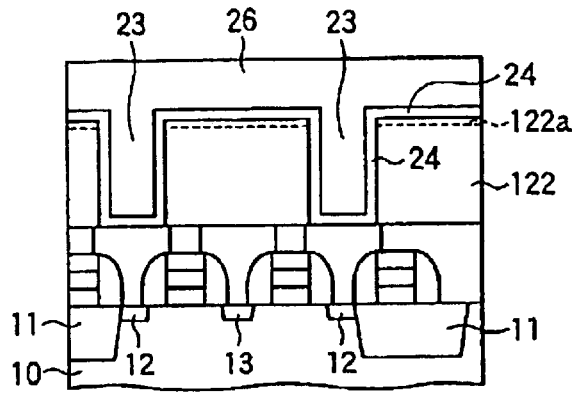
FIGS. 5(A) to 5(D) are sectional views showing respective steps of the method of fabricating the semiconductor integrated circuit according to the second embodiment.

Next, as shown in FIG. 5(A), an organic protection film 26, made of a resist or BARC (bottom anti-reflective coating), is formed on top of the polysilicon film 24 on the inner face of the respective holes 23, and on top of portions of the polysilicon film 24, outside of the respective holes 23, to thereby protect the polysilicon film 24.

Figure 5B:
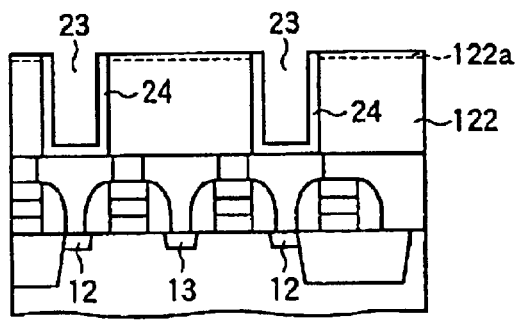

Subsequently, as shown in FIG. 5(B), the protection film 26 along with the portions of the polysilicon film 24, on top of the second BPSG film 122, are removed by etching back or CMP, and further, the respective protection films 26 inside the holes 23 are removed by use of an asher. The respective polysilicon films 24 left out inside the holes 23 after those steps will become the respective electrodes of the capacitors later. Further, as a result of removal of the portions of the polysilicon film 24, on top of the second BPSG film 122, the upper surface of the second BPSG film 122 is exposed.

In this connection, the respective polysilicon films 24 inside the holes 23 each may have HSG (Hemispherical Grain) or a rougher surface (by deposition of rough-surface polysilicon) in order to increase a surface area of each of the electrodes 24 with the aim of increasing capacitance of the respective capacitors.

Figure 5C:
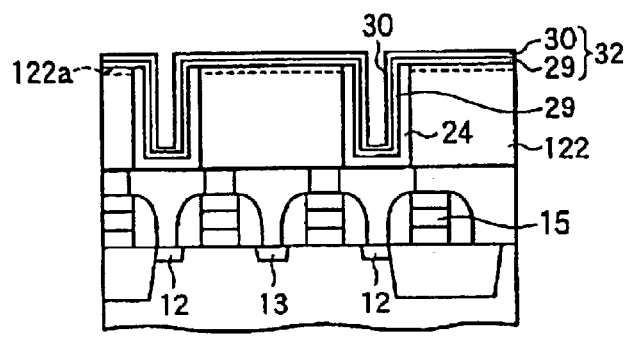

Then, as shown in FIG. 5(C), after prior-cleaning, nitriding by heating is executed in $NH_3$ atmosphere by use of a low pressure CVD (LP-CVD) furnace under conditions of, for example, process temperature at about 800 to 850° C., $NH_3$ as a source gas, a flow rate thereof at 2000 sccm, pressure at about 533 Pa (4 Torr), and process time of about 20 to 30 minutes. As a result of such nitriding, a thermal nitriding film 29 with an extremely small thickness is formed on the respective upper surfaces of the lower electrodes 24 of polysilicon. The thermal nitriding film 29 is formed to a thickness of, for example, on the order of 15 to 20 Å.

Next, following the formation of the thermal nitriding film 29, a silicon nitride film 30 is formed on top of the thermal nitriding film 29 in the same furnace by the CVD method.

CVD is executed under conditions of, for example, a substrate temperature at about 690° C., a flow rate of a source gas at $SiH_2Cl_2/NH_3=30/150$ (sccm), and pressure at about 20 Pa (0.15 Torr). A nitride film 32 made up of the silicon nitride film 30, formed by the CVD, and the thermal nitriding film 29 previously formed, in combination with the former, serves as a capacitor insulating film 32, and the CVD is executed such that the capacitor insulating film 32 is formed to a thickness of a predetermined value, for example, 40 Å.

Subsequently, healing oxidation at about 850° C. is applied to the capacitor insulating film 32 in a wet atmosphere in order to improve the film quality thereof.

Figure 5D:
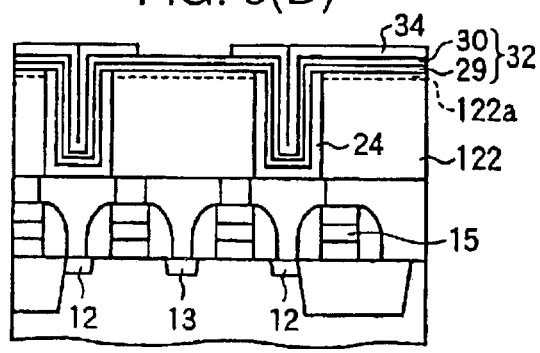

Next, as shown in FIG. 5(D), a polysilicon film 34 doped with phosphorus at 5E20/cm$^3$, serving as an upper electrode, is deposited on the capacitor insulating film 32, and a predetermined patterning is applied to the polysilicon film 34. The respective capacitors are thereby formed.

In addition, there are applied other steps such as the step of connecting the contact plug 21 connected with the respective diffused regions 13, serving as the source, to the bit line (not shown), however, description thereof is omitted herein.

As described in the foregoing, with the second embodiment of the invention, since supply of TEB, a supply source gas of boron, is stopped in the final stage of forming the second BPSG film 122, boron dose in the surface layer 122a of the second BPSG film 122 is lowered. As a result, because occurrence of incubation is curbed at the time of forming the silicon nitride film by the low pressure CVD method in a later stage, the silicon nitride film of a thickness equivalent to that of the silicon nitride film on top of the respective lower electrodes 24 can be formed over the second BPSG film 122 as well (FIG. 5(C)). Accordingly, sufficient oxidation resistance can be obtained even during the healing oxidation applied thereafter, so that it is possible to prevent intrusion of oxide species into the interior, and to prevent oxidation of the lower electrodes 24 and contact plugs 20. Hence, the capacitors having desired characteristics can be obtained.

With the present embodiment described above, the thickness of the capacitor insulating film 32 is 40 Å, preferably in a range of about 30 to 60 Å, however, the invention can be carried out even if the thickness is of a value other than those.

As described in the foregoing, with the invention, it is possible to prevent oxidation of the lower electrodes and contact plugs, so that a semiconductor integrated circuit having capacitors with desired characteristics can be fabricated.

What is claimed is:

1. A method of fabricating a semiconductor integrated circuit, comprising the steps of:

fabricating a plurality of MOSFETs by forming a plurality of diffused regions in a silicon substrate and a forming a plurality of gate electrodes;

forming a first BPSG film so as to cover the silicon substrate and the gate electrodes;

defining a plurality of first holes in the first BPSG film and forming a plurality of contact plugs, made of polysilicon and connected with the respective diffused regions, in the respective first holes;

forming a single second BPSG film on top of the first BPSG film and the respective contact plugs;

defining a plurality of second holes in the second BPSG film in such a way as to expose the respective upper surfaces of the contact plugs;

forming a first polysilicon film on the respective interiors of the second holes, and on top of an upper surface of the second BPSG film;

covering the first polysilicon film with a protection film;

exposing the upper surface of the second BPSG film by removing a plurality of portions of the first polysilicon film, on top of the second BPSG film, and the protection film on top of the portions of the first polysilicon film, and farther by removing the protection film inside the respective second holes while leaving the first polysilicon film inside the respective the second holes;

forming a nitride film on top of the first polysilicon film and the second BPSG film;

applying healing oxidation in a wet atmosphere; and forming a second polysilicon film on top of the nitride film, wherein the second BPSG film is formed in such a way as to lower a boron dose in a layer in the vicinity of an upper surface of the second BPSG film.

2. A method of fabricating a semiconductor integrated circuit according to claim 1, wherein the second BPSG film is formed by an atmospheric pressure CVD method so as to form the layer with a lowered boron dose in the vicinity of the surface of the second BPSG film by stopping supply of a boron source gas for a period corresponding to about 10% of film-forming time from the end thereof.

3. A method of fabricating a semiconductor integrated circuit according to claim 1, wherein the step of forming the nitride film, comprises forming a first nitride film on top of the first polysilicon film by heating in NH3 atmosphere by use of a low pressure CVD furnace, and forming a silicon nitride film on top of the first nitride film by a CVD method.

4. A method of fabricating a semiconductor integrated circuit according to claim 1, wherein the step of removing a plurality of portions of the first polysilicon film, on top of the second BPSG film, and the protection film on top of the portions of the first polysilicon film is executed by etching and CMP.

5. A method of fabricating a semiconductor integrated circuit according to claim 1, wherein the removal of the protection film inside the respective second holes is executed by use of an asher.

6. A method of fabricating a semiconductor integrated circuit according to claim 1, wherein the first polysilicon film is rendered to have a rougher surface or HSG (Hemispherical Grain).

7. A method of fabricating a semiconductor integrated circuit according to claim 1, wherein a thickness of the nitride film is in a range of about 30 to 60 Å.

8. A method of manufacturing a semiconductor device, comprising:

providing a semiconductor substrate;

forming an isolation region, a transistor and a contact on the semiconductor substrate;

forming a first insulating layer for covering the isolation region, the transistor and the contact;

forming a single second insulating layer formed on the first insulating layer by supplying a first source gas containing boron and a second source gas containing no boron, wherein the first source gas is not supplied during about a last 10% duration of a total forming time of the second insulating layer;

removing a part of the second insulating layer so as to form a hole;

forming a lower electrode layer formed on a surface of the hole;

forming a nitride layer formed on the second insulating layer and the lower electrode layer; and forming an upper electrode layer formed on the nitride layer corresponding to the lower electrode layer.

9. A method of manufacturing a semiconductor device according to claim 8, wherein the second insulating layer is a boronphosphosilicate glass layer.

10. A method of manufacturing a semiconductor device according to claim 9, wherein a first gas includes a triethyl boron and a second gas includes tetraethylorthosilicate and trimethlphosphate.

11. A method of manufacturing a semiconductor device according to claim 8, wherein the formation of the nitride layer includes, nitriding the second insulating layer and the lower electrode layer to form a thermal nitride layer on the second insulating layer and the lower electrode layer, and forming a silicon nitride layer on the thermal nitride layer.

12. A method of manufacturing a semiconductor device according to claim 8, wherein the silicon nitride layer is formed by a CVD method.

13. A method of manufacturing a semiconductor device according to claim 8, wherein the formation of the lower electrode layer includes, forming the lower electrode layer on the second insulating layer and the surface of the hole;

forming an organic protection layer on the lower electrode layer;

etching back the organic protection layer and the lower electrode layer formed on the second insulating layer so that the organic protection layer and the lower electrode layer on the surface of the hole are remained; and removing the remaining organic protection layer.

14. A method of manufacturing a semiconductor device according to claim 13, wherein the remaining organic protection layer is removed by ashing.

15. A method of manufacturing a semiconductor device, comprising:

providing a semiconductor substrate;

forming an isolation region, a transistor and a contact on the semiconductor substrate;

forming a first insulating layer for covering the isolation region, the transistor and the contact;

forming a single second insulating layer formed on the first insulating layer, wherein the second insulating layer has a normal boron concentration portion at a middle portion and a bottom portion and a lower boron concentration portion at a top surface region;

removing a part of the second insulating layer so as to form a bole;

forming a lower electrode layer formed on a surface of the hole;

forming a nitride layer formed on the second insulating layer and the lower electrode layer; and forming an upper electrode layer formed on the nitride layer corresponding to the lower electrode layer.

16. A method of manufacturing a semiconductor device according to claim 15, wherein the second insulating layer is formed by supplying a first source gas containing boron and a second source gas containing no boron, wherein the first source gas is not supplied during about a last 10% duration of a total forming time of the second insulating layer.

17. A method of manufacturing a semiconductor device according to claim 15, wherein the second insulating layer is a boronphosphosilicate glass layer.

18. A method of manufacturing a semiconductor device according to claim 17, wherein a first gas includes a triethyl boron and a second gas includes tetraethylorthosilicate and trimethlphosphate.

19. A method of manufacturing a semiconductor device according to claim 15, wherein the formation of the nitride layer includes, nitriding the second insulating layer and the lower electrode layer to form a thermal nitride layer on the second insulating layer and the lower electrode layer; and forming a silicon nitride layer on the thermal nitride layer.

20. A method of manufacturing a semiconductor device according to claim 15, wherein the silicon nitride layer is formed by a CVD method.

21. A method of manufacturing a semiconductor device according to claim 15, wherein the formation of the lower electrode layer includes, forming the lower electrode layer on the second insulating layer and the surface of the hole;

forming an organic protection layer on the lower electrode layer;

etching back the organic protection layer and the lower electrode layer formed on the second insulating layer so that the organic protection layer and the lower electrode layer on the surface of the hole are remained; and removing the remaining organic protection layer.

22. A method of manufacturing a semiconductor device according to claim 21, wherein the remaining organic protection layer is removed by ashing.

\* \* \* \* \*